US012566226B2

(12) United States Patent
Pyne et al.

(10) Patent No.: US 12,566,226 B2
(45) Date of Patent: Mar. 3, 2026

(54) ELECTRICAL CONNECTION FOR USE IN CRYOGENIC APPLICATIONS

(71) Applicant: KONINKLIJKE PHILIPS N.V., Eindhoven (NL)

(72) Inventors: Alexander James Pyne, Latham, NY (US); Kevin Grace, Latham, NY (US)

(73) Assignee: Koninklijke Philips N.V., Eindhoven (NL)

( * ) Notice: Subject to any disclaimer, the term of this patent is extended or adjusted under 35 U.S.C. 154(b) by 143 days.

(21) Appl. No.: 18/576,388

(22) PCT Filed: Jun. 20, 2022

(86) PCT No.: PCT/EP2022/066687
§ 371 (c)(1),
(2) Date: Jan. 4, 2024

(87) PCT Pub. No.: WO2023/280556
PCT Pub. Date: Jan. 12, 2023

(65) Prior Publication Data
US 2025/0004075 A1      Jan. 2, 2025

Related U.S. Application Data

(60) Provisional application No. 63/218,650, filed on Jul. 6, 2021.

(51) Int. Cl.
*G01R 33/36* (2006.01)
*G01R 33/3815* (2006.01)
(Continued)

(52) U.S. Cl.
CPC ......... *G01R 33/36* (2013.01); *G01R 33/3815* (2013.01); *H01C 10/06* (2013.01); *H01F 6/065* (2013.01)

(58) Field of Classification Search
CPC ..... G01R 33/36; G01R 33/3815; H01F 6/065; H01F 6/008; H01F 6/006
See application file for complete search history.

(56) References Cited

U.S. PATENT DOCUMENTS 1,036,304 A * 8/1912 Misland ................. H01C 10/06
                                                   338/93
1,602,671 A * 10/1926 Henderson .............. H01F 29/12
                                                   338/180
(Continued)

FOREIGN PATENT DOCUMENTS

DE        DD-267833 A1 * 5/1989
JP           62106675 A   5/1987
(Continued)

OTHER PUBLICATIONS

International Search Report and Written Opinion from PCT/EP2022/066687 mailed Oct. 20, 2022.

*Primary Examiner* — Daniel R Miller

(57) ABSTRACT

An apparatus for making an electrical connection between a superconducting component disposed in a cryogenic chamber and an electrical device disposed outside the cryogenic chamber is described. The apparatus includes a coil comprising a plurality of helical loops and disposed in the cryogenic chamber; and an actuator configured to compress and expand the coil between a first state and a second state. In the first state, the coil has a first electrical resistance and a first thermal conductance and in the second state the coil has a second electrical resistance and a second thermal conductance.

20 Claims, 8 Drawing Sheets

(51) Int. Cl.
*H01C 10/06* (2006.01)
*H01F 6/06* (2006.01)

(56) References Cited

U.S. PATENT DOCUMENTS

| | | | | |
|---|---|---|---|---|
| 2,710,898 A | * | 6/1955 | Greene .................. | H01C 10/10 |
| | | | | 338/180 |
| 3,629,774 A | * | 12/1971 | Crites .................. | H01C 10/106 |
| | | | | 252/502 |
| 6,657,526 B2 | | 12/2003 | Nagashima et al. | |
| 2015/0287552 A1 | * | 10/2015 | Anderson ............. | H01H 1/242 |
| | | | | 200/276.1 |

FOREIGN PATENT DOCUMENTS

| | | | | |
|---|---|---|---|---|
| JP | 07283023 A | | 10/1995 | |
| JP | 0817621 A | | 1/1996 | |
| JP | 0869719 A | | 3/1996 | |
| JP | 2007250972 A | * | 9/2007 | |
| JP | 2011146292 A | | 7/2011 | |
| WO | 2020035309 A1 | | 2/2020 | |

* cited by examiner

800

PROVIDING AN APPARATUS, WHICH COMPRISES A COIL COMPRISING A PLURALITY OF HELICAL LOOPS ⌇ 801

COMPRESSING THE COIL TO A FIRST STATE ⌇ 802

EXPANDING THE APPARATUS TO A SECOND STATE ⌇ 803

ELECTRICAL CONNECTION FOR USE IN CRYOGENIC APPLICATIONS

CROSS REFERENCE TO RELATED APPLICATIONS

This application is a U.S. national phase application of International Application No. PCT/EP2022/066687 filed on Jun. 20, 2022, which claims the benefit of U.S. Application Ser. No. 63/218,650 filed on Jul. 6, 2021 and is incorporated herein by reference.

BACKGROUND

Superconducting devices, including superconducting magnets, are generally maintained at very low temperatures (e.g., close to absolute zero) by placing the superconducting magnet into a chamber, which is maintained at very low pressure and including a cooling agent. These superconducting devices are ubiquitous in applications, with one common application being in magnetic resonance imaging (MRI) systems commonly used in healthcare.

Maintaining the temperature at a constant low temperature in these so-called cryogenic chambers is very important to the proper operation of the superconductor that makes up the superconducting magnet. As such, maintaining the seal of the cryogenic chamber is very important to ensure heat from outside the cryogenic chamber does not significantly adversely impact the internal temperature of the cryogenic chamber. However, electrical connections must be made from room-temperature equipment to superconducting components (e.g., a superconducting magnet). For example, current must be applied from an external a power supply to the superconducting components for their operation. However, in making the electrical connections between the external devices and the superconducting components inside the cryogenic chamber, pathways for heat conduction may be created, and as a result unacceptable levels of heat may pass from the ambient into the cryogenic chamber that can compromise the desired superconducting properties of the superconducting components in the cryogenic chamber.

Typical superconducting components (e.g., magnets) use liquid helium baths to maintain cryogenic temperature of superconducting coils and ancillaries housed within a cryogenic chamber. In certain known systems, electrical connections to these types of magnetic coils is often provided by removable electrical leads that penetrate the pressure vessel, relying on the constant vaporization of included liquid helium to temporarily remove heat conducted along, and generated by, these leads. As such, during ramp-up operation of the superconducting components, these electrical leads are inserted through the cryogenic chamber, and once steady-state operation is achieved, these leads are removed to reduce the heat load to the refrigeration system. Specifically, and as is known to those ordinarily skilled in the art, after ramping up the magnet to full current, a superconducting switch is closed to create a loop.

However, some superconducting magnets include a sealed cooling system within a vacuum space of the cryogenic chamber that directly cools the superconducting components. In such applications, an electrical path for making electrical connections from an electrical device (e.g., power supply) located outside the cryogenic chamber to the superconducting components is required. Known connections result in an unacceptable degree of thermal conductivity along the electrical connections. As such, the performance of the superconducting components can be deleteriously compromised using known electrical connections.

What is needed, therefore, is an electrical connection between a superconducting component disposed in a cryogenic chamber and an electrical device disposed outside the cryogenic chamber that overcomes at least the drawbacks of known electrical connections described above.

SUMMARY

According to an aspect of the present disclosure, an apparatus for making an electrical connection between a superconducting component disposed in a cryogenic chamber and an electrical device disposed outside the cryogenic chamber is disclosed. The apparatus comprises: a coil comprising a plurality of helical loops; and an actuator configured to compress and expand the coil between a first state and a second state. The first state the coil has a first electrical resistance and a first thermal conductance and in the second state the coil has a second electrical resistance and a second thermal conductance.

According to another aspect of the present disclosure, a method of providing electrical current to a superconductor component disposed in a cryogenic chamber is disclosed. The method comprises: providing an apparatus, which comprises a coil comprising a plurality of helical loops; compressing the coil to a first state, wherein in the first state the coil has a first electrical resistance and a first thermal conductance; and expanding the coil to a second state, wherein in the second state the coil has a second electrical resistance and a second thermal conductance.

According to another aspect of the present disclosure, a magnetic resonance imaging (MRI) system comprises: a magnet system comprising a superconducting magnet disposed in a cryogenic chamber; and an apparatus for making an electrical connection between the superconducting component disposed in a cryogenic chamber and an electrical device disposed outside the cryogenic chamber. The apparatus comprises: a coil comprising a plurality of helical loops; and an actuator configured to compress and expand the coil between a first state and a second state. In the first state the coil has a first electrical resistance and a first thermal conductance, and in the second state the coil has a second electrical resistance and a second thermal conductance.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
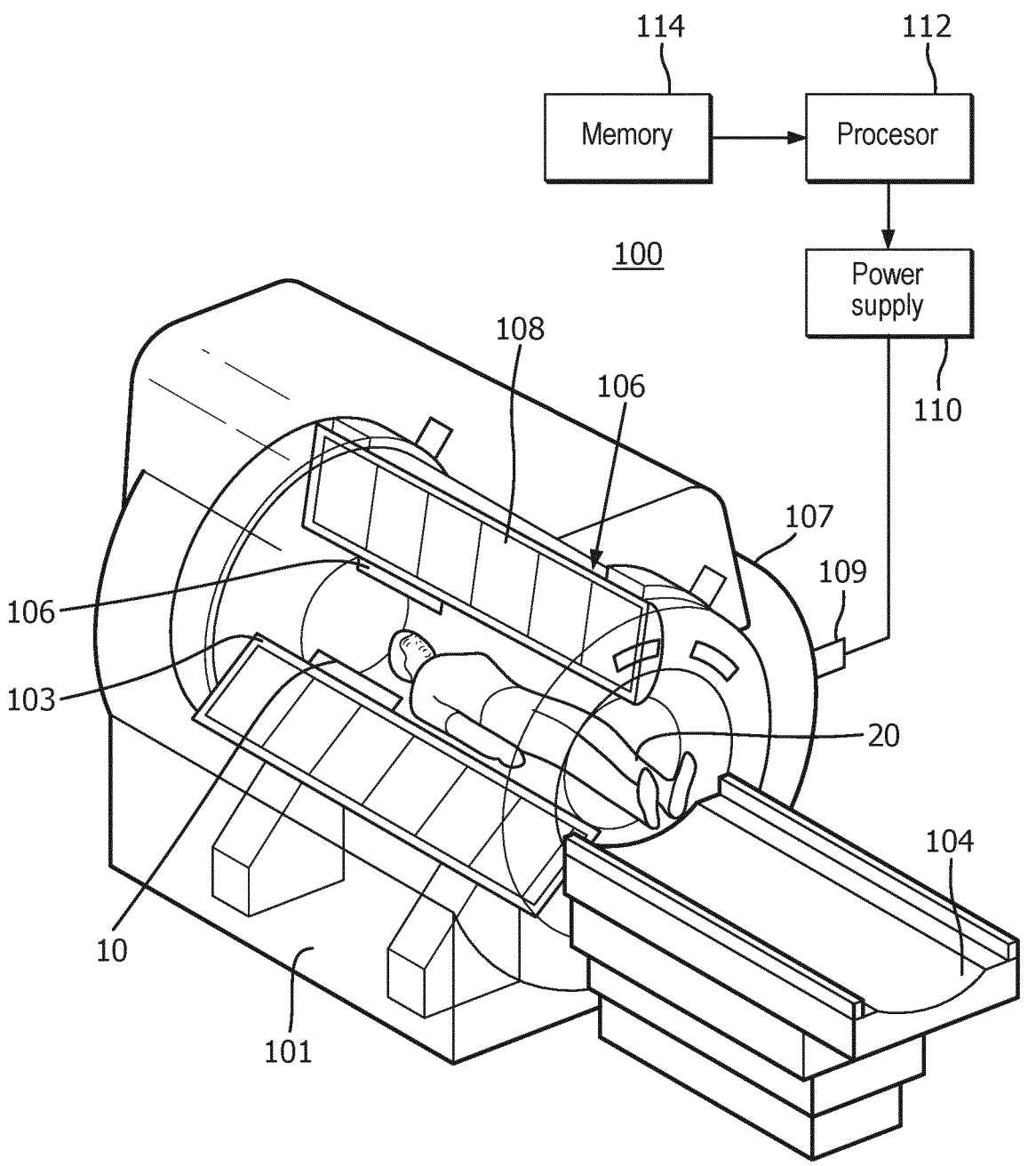
FIG. 1 illustrates a magnetic resonance imaging (MRI) system, according to a representative embodiment.

In the following detailed description, for the purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third, etc. may be used herein to describe various elements or components, these elements or components should not be limited by these terms. These terms are only used to distinguish one element or component from another element or component. Thus, a first element or component discussed below could be termed a second element or component without departing from the teachings of the inventive concept.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," "comprising," and/or similar terms specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

As used in the specification and appended claims, and in addition to their ordinary meanings, the terms 'substantial' or 'substantially' mean to with acceptable limits or degree. For example, 'substantially thermally isolated' means that one skilled in the art would consider the thermal isolation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

The present disclosure, through one or more of its various aspects, describes embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

By the present teachings and apparatus and method are disclosed for providing an electrical connection between a sealed superconducting magnet that reduces thermal loss from the cryogenic chamber. In certain embodiments, the apparatus is connected to an actuator (e.g., a solenoid-actuated electrical switch) disposed in the vacuum space of the cryogenic chamber to allow an electrical connection between an electrical device disposed in a room-temperature space and the superconducting magnet disposed in the cryogenic chamber during transient use, while substantially thermally preventing significant thermal loss from the cryogenic chamber (i.e., providing substantially thermal isolation of the superconducting magnet) during steady-state operation.

Beneficially, and as will be described more fully below, the apparatuses and methods of the present teachings substantially overcome the difficulties of balancing the magnetic bistable behavior (i.e., ramp-up operation and steady-state operation) within a magnetic system, ohmic heat generation, thermal conduction, and ice intolerance. As described more fully below, the apparatus described in connection with various representative embodiments achieves lower ohmic heat generation, similar steady-state heat conduction, lower transient-state heat conduction, and superior ice tolerance compared to known electrical connections. These improvements yield performance increases in the areas of refrigeration capacity, magnet system availability, and magnet system reliability, and magnet manufacturability, to name a few. Finally, while various representative embodiments of the apparatuses and methods of the present teachings are described in connection with magnetic resonance imaging (MRI) systems, it is emphasized that this is merely an illustrative application. More generally, the apparatuses and methods of the present teachings are contemplated for use in a other applications where an electrical connection is needed to be made between a device disposed in a cryogenic chamber and an electrical device disposed outside the cryogenic chamber and at a higher temperature (e.g., room temperature).

The electrical connection to the superconducting magnet provided by the apparatus of various illustrative embodiments described below is needed to change the state of the magnetic field. Current is applied to the superconducting coils via the apparatus in a first state to ramp up when the magnet is needed for imaging. Once full field is achieved and the superconducting circuit is complete, the apparatus is put into a second state. As described more fully below, in the second state, both electrical conduction and thermal conduction by the apparatus are approximately two (2) orders of magnitude lower than in the first state.

In certain circumstances, current is removed from the superconducting coils via the apparatus by returning the apparatus to the first state and reducing the voltage to zero. The actuation of the apparatus can be controlled via onboard magnet electronics that determines when the device can switch from the first state to the second or vice versa. The electronics use known algorithms to determine when actuation of the apparatus should take place based on inputs from a number of sensors. These electronics may comprise processor 112, memory 114 and actuators 304, 404, 504, and may be part of MRI system 100 described below, and can function according to method 800 described below. Alternatively, the apparatus could also be operated manually to change between the first and second states based on timing and sequence of ramp up/down events.

Despite the ability of the magnet to remain at field for very long periods of time (years) without any outside intervention, there are reasons for ramping the superconducting magnet down and then ramping the superconducting magnet up again for operation. These include, for example, preventative maintenance schedules for external magnet system components, imaging suite cleaning or maintenance, safety, loss of power and other common occurrences. By the present teachings, these desired ramp ups and ramp downs of the superconducting magnet can be carried out without compromising the seal of the cryogenic chamber that houses the superconducting magnet. Moreover, during the comparatively long periods of operation, the apparatus of various representative embodiments reduces thermal loss from the cryogenic chamber to an acceptable level. For purposes of illustration, the thermal loss in the second state is approximately two orders of magnitude lower compared to thermal loss in the first state (e.g., during ramp-up).

FIG. 1 illustrates an exemplary embodiment of an MRI system 100 in accordance with a representative embodiment. MRI system 100 includes a magnet system 101; a patient table 104 configured to hold a subject or patient 20; gradient coils 103 configured to at least partially surround at least a portion of patient 20 for which MRI system 100 generates an image; and a radio frequency coil 105 configured to apply a radio frequency signal to at least the portion of a subject or patient 20 which is being imaged, and to perturb the alignment of the magnetic field; and one or more sensors 10 configured to detect changes in the magnetic field caused by the radio frequency signal and patient 20. Notably, the magnet system 101 comprises a main magnet 106 disposed in a cryogenic chamber 107. The main magnet 106 comprises superconducting coils 108 that are maintained at a suitable temperature and pressure via the cryogenic chamber 107. As alluded to above, the magnet system 101 is sealed, with electrical connections made through a conduit 109 and with a two-state apparatus (not shown in FIG. 1) that connects the superconducting coils 108 to a power supply (not shown) used to power the superconducting magnet. Notably, while the MRI system 100 is illustrated in the singular, the term "system" shall also be taken to include any collection of systems or sub-systems that individually or jointly execute a set, or multiple sets, of software instructions.

The MRI system 100 also comprises a power supply 110, a processor 112 and a memory 114. In combination, the memory 114 and processor 112 may be referred to as a controller. In certain representative embodiments, the memory 114 and the processor 112 may be components of the main system (not shown) used to control the various components of the system. Alternatively, the memory 114 and the processor 112 may be separate elements from the main system. The controller may comprise a display (not shown), including but not limited to a light emitting diode (LED), a liquid crystal display (LCD), an organic light emitting diode (OLED) display, a flat panel display, a solid-state display, or a cathode ray tube (CRT), for example. The controller comprising the memory 114 and the processor 112 may be housed within or linked to a workstation (not shown) such as a computer or another assembly of one or more computing devices, a display/monitor, and one or more input devices (e.g., a keyboard, joysticks and mouse) in the form of a standalone computing system, a desktop or a tablet, for example, to perform one or more computer functions.

The processor 112, which is tangible and non-transitory, is representative of one or more processors. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time. The processor 112 (and other processors) of the present teachings is an article of manufacture and/or a machine component.

The processor 112 is configured to execute software instructions stored in the memory 114 to perform various functions, including, ramp up and ramp down of the superconducting magnet using the apparatus described in the various embodiments herein. The processor 112 may be a general-purpose processor or may be part of an application specific integrated circuit (ASIC). The processor 112 may also be (or include) a microprocessor, a microcomputer, a processor chip, a controller, a microcontroller, a digital signal processor (DSP), a state machine, or a programmable logic device. The processor 112 may also be (or include) a logical circuit, including a programmable gate array (PGA) such as a FPGA, or another type of circuit that includes discrete gate and/or transistor logic. The processor 112 may be (or include) a central processing unit (CPU), a graphics processing unit (GPU), or both. Additionally, the processor 112 may comprise multiple processors, parallel processors, or both. Multiple processors may be included in, or coupled to, a single device or multiple devices.

The memory 114 may comprise a main memory, a static memory, or both, where the memories may communicate with each other via a bus (not shown). The memory 114 described herein are tangible storage mediums that can store data and executable instructions, and are non-transitory during the time instructions are stored therein. As used herein, the term "non-transitory" is to be interpreted not as an eternal characteristic of a state, but as a characteristic of a state that will last for a period. The term "non-transitory"

specifically disavows fleeting characteristics such as characteristics of a carrier wave or signal or other forms that exist only transitorily in any place at any time.

The memory 114 of the present teachings is an article of manufacture and/or machine component. The memory 114 includes one or more computer-readable mediums from which data and executable instructions (e.g., to carry out the processes described in connections with ramp-up and steady state operations) can be read by the processor 112. Memories as described herein may be random access memory (RAM), read only memory (ROM), flash memory, electrically programmable read only memory (EPROM), electrically erasable programmable read-only memory (EEPROM), registers, a hard disk, a removable disk, tape, compact disk read only memory (CD-ROM), digital versatile disk (DVD), floppy disk, Blu-ray disk, or any other form of storage medium known to one of ordinary skill in the art. Memories of the present teachings may be volatile or non-volatile, secure and/or encrypted, unsecure and/or unencrypted. A monitor and interface (not shown), the processor 112 and the memory 114 may be housed within or linked to a workstation (not shown) such as a computer or another assembly of one or more computing devices, a display/monitor, and one or more input devices (e.g., a keyboard, joysticks and mouse) in the form of a standalone computing system, a desktop or a tablet, for example.

For purposes of illustration, the main magnet is illustratively a sealed 1.5 T (or greater) MRI magnets commercially available from Koninklijke Philips N.V. The apparatus, which is described below, allows for an electrical connection between the external power supply at 300 K to superconducting magnets maintained at 40 K and with improved electrical and thermal characteristics compared to known connections. It is emphasized, however, that the apparatus is not limited to use in MRI devices and systems, but rather may be implemented in one of a number of applications in which an electrical connection is needed across comparatively large temperature gradients requiring certain desired electrical and thermal behavior. As such, the apparatuses of various embodiments of the present teachings allow an electrical connection across an interface between a comparatively cold environment (e.g., a cryogenic chamber) and a comparatively warm environment (e.g., room temperature).

Figure 2:
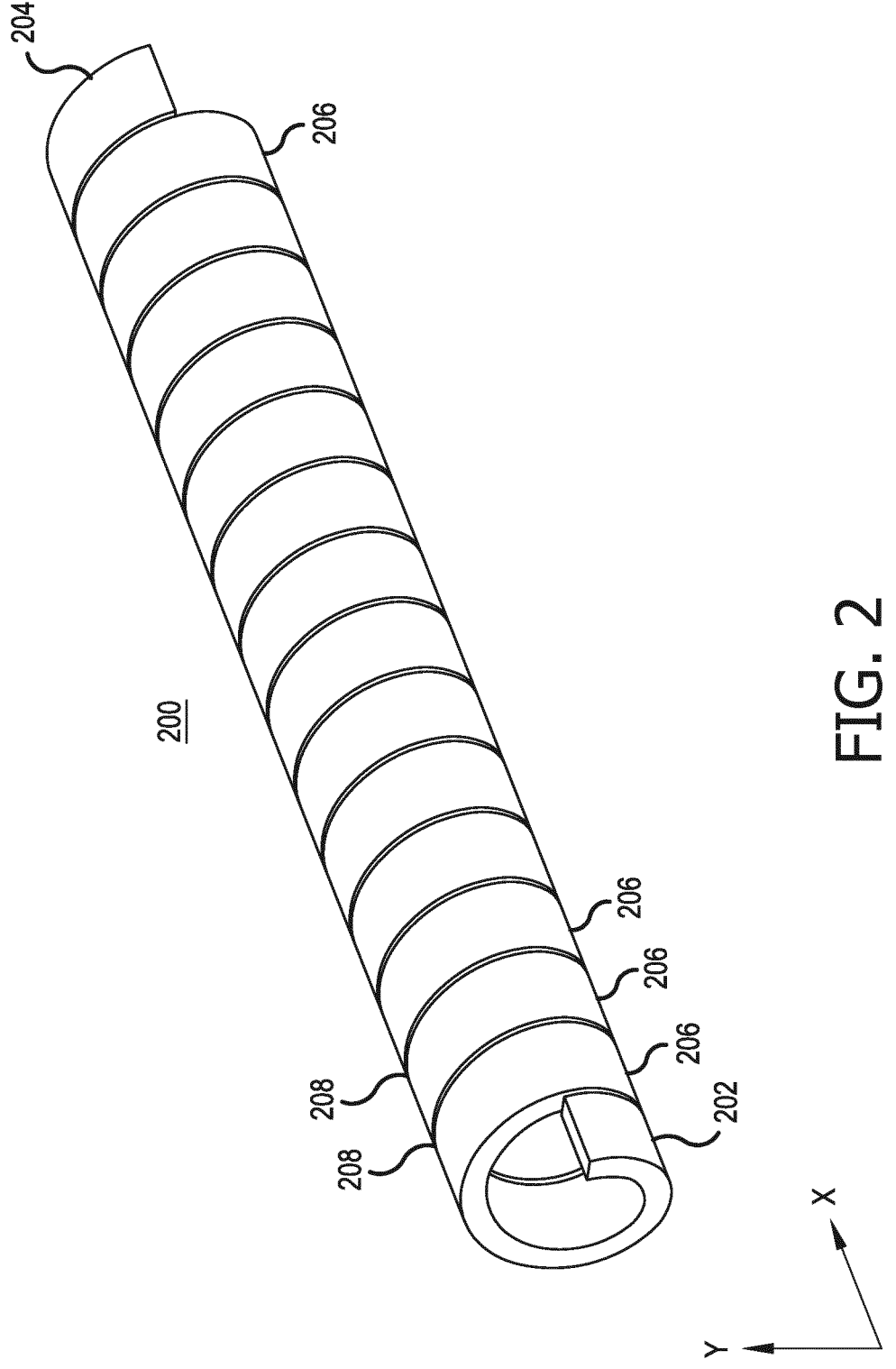
FIG. 2 is a perspective view of an apparatus for making electrical connections between a superconducting component disposed in a cryogenic chamber and an electrical device disposed outside the cryogenic chamber according to a representative embodiment.

FIG. 2 is a perspective view of an apparatus 200 for making electrical connections between a superconducting component (not shown in FIG. 2) disposed in a cryogenic chamber (not shown in FIG. 2) and an electrical device (not shown in FIG. 2) disposed outside the cryogenic chamber according to a representative embodiment. The apparatus 200 has a first end 202 and a second end 204 and a plurality of helical loops 206 between the first end 202 and the second end 204. As will be appreciated as the present description continues, the apparatus provides an electrical path and a thermal path between the superconducting component and the electrical device. In FIG. 2, the apparatus is shown in a compressed state (sometimes referred to as a first state), which results in an increase in cross-sectional area, and a resultant decrease in electrical resistance and an increase in thermal conductivity compared to the apparatus 200 when stretched to an expanded state (sometimes referred to as a second state).

The apparatus 200 is generally made of a flexible, electrically-conductive material cut to provide seams 208 adapted to be compressed in the −x direction of the coordinate system of FIG. 2 or stretched in the +x direction of the coordinate system of FIG. 2. Illustratively, the electrically-conductive material comprises copper or aluminum, and the apparatus 200 in a compressed state has a length along the axial direction (x-direction of the coordinate system of FIG. 2) of approximately 4 inches.

As described more fully below, when compressed, the seams 208 between adjacent helical loops 206 are beneficially have substantially no gaps therebetween, since adjacent helical loops 206 are in physical contact with one another. By contrast, when stretched, the seams 208 between the adjacent helical loops are comparatively large and generally prevent one helical loop 206 from making physical contact with an adjacent helical loop 206. Just by way of illustration, in the uncompressed state, the seams 208 form gaps between approximately 0.050 in. and 0.100 in. Notably, the gap is generally governed by the required distance of motion and force required to expand the apparatus in the second state. Accordingly, the apparatus 200 is a continuous structure that can be compressed to the first state and stretched to the second state to change its effective cross section and change both its electrical and thermal conductivities as described below.

Figure 3:
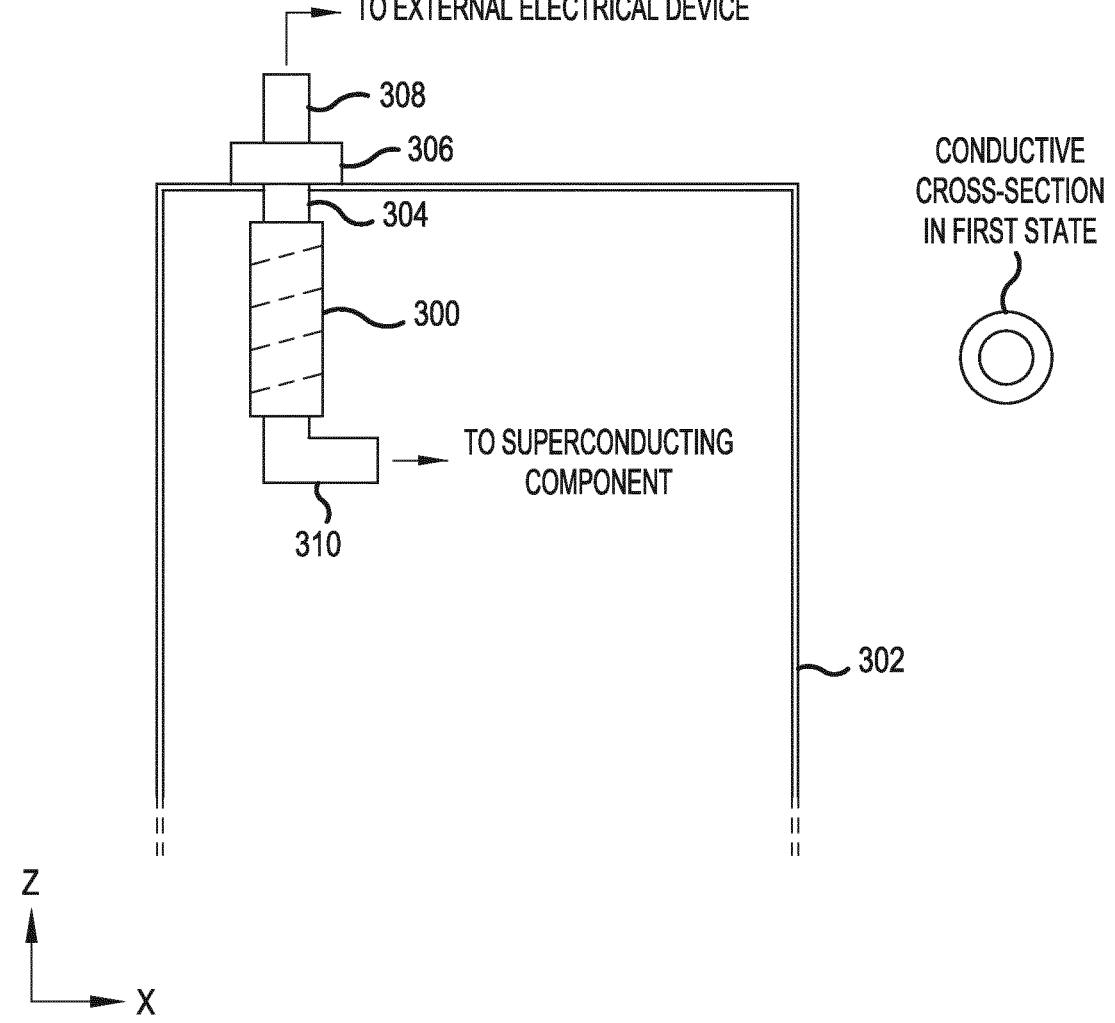
FIG. 3 is cross-sectional view of an apparatus for making an electrical connection disposed in a cryogenic chamber in a first state according to a representative embodiment.

FIG. 3 is cross-sectional view of an apparatus 300 for making an electrical connection disposed in a cryogenic chamber 302 in a first state according to a representative embodiment. Various aspects and details of the apparatus 300 are similar or identical to those described in connection with representative embodiments of FIGS. 1 and 2, and may not be repeated to avoid obscuring the description of the present representative embodiment.

The apparatus 300 is disposed in a cryogenic chamber 302, and comprises an actuator 304, which illustratively comprises an electrical solenoid actuation device. More generally, the actuator 304 may be one of a number of devices that provides a suitable force to expand/compress the apparatus 300. These include but are not limited to known linear motors or a translational mechanism such has a cam, piston or rod. As described more fully below, the actuator 304 is adapted to compress (in the −z direction of the coordinate system shown) the apparatus 300 when connection for providing electrical power from a power supply (not shown) to superconducting components is needed. As noted above, compression results in the apparatus' being in a first state in which the apparatus forms an electrically (and thermally) conducting tube. By contrast, and as described more fully below, when the superconducting components are functioning in a steady state mode, the actuator applies a force to expand the apparatus 300, and the apparatus 300 is in a second state in which the seams between the helical loops that comprise the apparatus 300 are comparatively large and generally prevent one helical loop from making physical contact with an adjacent helical loop. As noted above, in this second state the electrical resistance is comparatively high, and the thermal conductance is comparatively low. The apparatus 300 is connected through the cryogenic chamber 302 using a conduit 306. The conduit 306 is illustratively a ceramic piece (e.g., ring) through which an electrical connection 308 is made to the actuator 304 and the apparatus 300. The conduit 306 beneficially is a poor thermal conductor and thereby reduces the transfer of heat from the ambient to the cryogenic chamber 302 to avoid significantly impacting the performance of the superconducting components disposed in the cryogenic chamber. Accordingly, the conduit 306 generally comprises a ceramic material that substantially provides electrical and thermal isolation from the ambient or outer cryogenic vessel with a substantially leak free seal. The conduit 306 generally has a diameter of approximately 2 in. to approximately 3 in., and a thickness (x-direction in the coordinate system of FIG. 3) of approximately 0.5 in.

In the first state, apparatus 300 is adapted to provide a comparatively low electrical resistance path between an external electrical device and the superconducting component in the cryogenic chamber. As alluded to above, and as described more fully below, in the compressed state (first state), the apparatus provides a substantially solid tube having a ring-shaped cross-section as shown. This ring-shaped cross-section provides a large electrically (and thermally) conductive cross-section compared to the separated helical loops when the apparatus 300 is not compressed. As such, in this first state the electrical resistance is beneficially low compared to the electrical resistance in the second state, discussed more fully below.

For example, when the superconducting component requires a ramp up, the actuator 304 compresses the apparatus 300 and provides an electrical path from the external electronic device (e.g., a power supply) through the (external) electrical connection 308 to an internal electrical connection 310, which is electrically connected to the superconducting component. As will be appreciated, the apparatus 300 allows for an electrical connection between the external electrical device (e.g., a power supply) at 300 K to the superconducting components (e.g., magnets of an MRI device or system) maintained at 40 K and with improved electrical and thermal characteristics compared to known connections.

Figure 4:
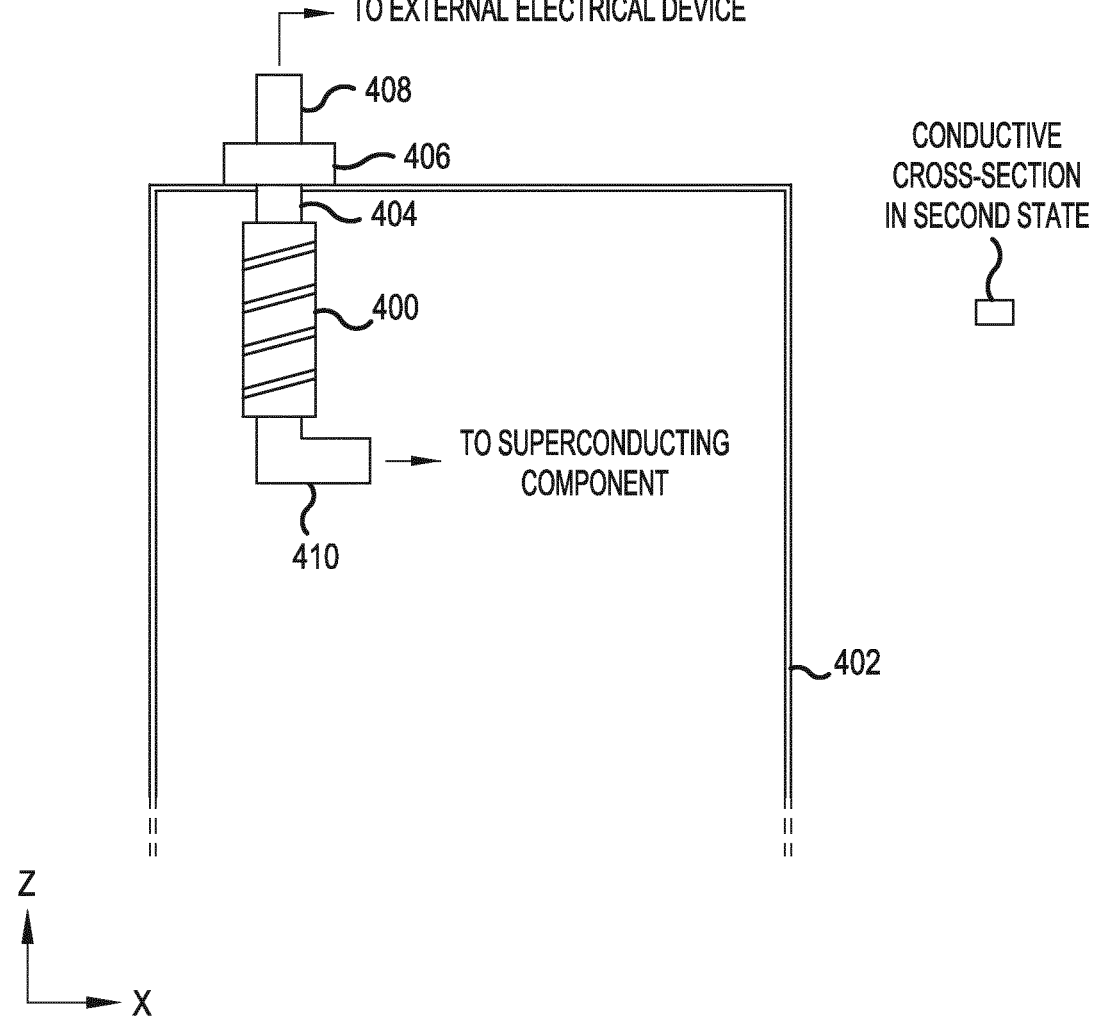
FIG. 4 is cross-sectional view of an apparatus for making an electrical connection disposed in a cryogenic chamber in a second state according to a representative embodiment.

FIG. 4 is cross-sectional view of an apparatus 400 for making an electrical connection disposed in a cryogenic chamber in a second state according to a representative embodiment. Various aspects and details of the apparatus 400 are similar or identical to those described in connection with representative embodiments of FIGS. 1-3, and may not be repeated to avoid obscuring the description of the present representative embodiment.

The apparatus 400 is disposed in a cryogenic chamber 402, and comprises an actuator 404, which illustratively comprises a solenoid actuation device. As described more fully below, the actuator 404 is adapted to expand (in the +z direction of the coordinate system shown) the apparatus 400 when the superconducting component is operating in a steady state with substantially no electrical power supplied to the superconducting component. As noted above, expansion of the apparatus 400 results in the apparatus' being in a second state in which the seams between the helical loops that comprise the apparatus 400 are comparatively large and generally prevent one helical loop from making physical contact with an adjacent helical loop. As noted above, in this second state the electrical resistance is comparatively high, and the thermal conductance is comparatively low.

The apparatus 400 is connected through the cryogenic chamber 402 using a conduit 406. The conduit 406 is substantially the same as conduit 306 discussed above, illustratively comprising a ceramic piece (e.g., ring) through which an electrical connection 408 is made to the actuator 404 and the apparatus 400. The conduit 406 beneficially is a poor thermal conductor and thereby reduces the transfer of heat from the ambient to the cryogenic chamber 402 to avoid significantly impacting the performance of the superconducting components disposed in the cryogenic chamber.

In the second state, apparatus 400 is adapted to provide a comparatively high electrical resistance path between an external electrical device and the superconducting component in the cryogenic chamber 402. As alluded to above, and as described more fully below, in the expanded state (second state), the apparatus provides a substantially rectangular shape cross-section as shown. This rectangular-shaped cross-section provides a small electrically (and thermally) conductive cross-section compared to the ring-shaped cross-section loops when the apparatus 400 is compressed. As such, in this second state the thermal resistance is beneficially high compared to the thermal resistance of the apparatus 400 in the first state, discussed more fully below.

For example, when the superconducting component requires steady state operation, the actuator 404 expands the apparatus 400. Because the conductive cross-section of the apparatus 400 is comparatively small, the electrical and thermal resistance of an electrical path from the external electronic device (e.g., a power supply) through the (external) electrical connection 408 to an internal electrical connection 410 that is electrically connected to the superconducting component is comparatively large. As such, in the second state during steady state operation, electrical current conduction and thermal conduction are reduced to acceptable values. Illustratively, in the second state during steady state operation, electrical current conduction and thermal conduction are reduced to acceptable levels. Illustratively, in the second state during steady state operation, electrical current conduction and thermal conduction are on the order of two orders of magnitude lower than the electrical current conduction and thermal conduction compared to the apparatus 300 described above. Beneficially, this reduces the thermal loss from the cryogenic chamber 402. As will be appreciated, the apparatus 400 allows for an electrical connection between the external electrical device (e.g., a power supply) at 300 K to the superconducting components (e.g., magnets of an MRI device or system) maintained at 40 K and with improved electrical and thermal characteristics compared to known connections.

Beneficially, the comparatively low electrical conductivity in the second state fosters a type of self-cleaning. Specifically, when the magnet is operating in steady state, ice formation on surfaces is not an uncommon problem. This occurs even in cases of substantially no moisture, as ice can form from nitrogen in the environment. In known devices, ice can form on the contact pads of the electrical connection. As such, a clear benefit of the apparatus 400 is due to the helical coil design. To this end, if ice forms between adjacent turns between adjacent helical coils (e.g., in seams 508 of adjacent helical loops 506 of representative embodiments discussed below) when the apparatus 400 is in the second state during steady state operation, actuation to compress the apparatus to the first state, causes compression of the helical loops and, as discussed below, reduces the conductive cross-section at the point the ice formed will isolate those turns of the coil (maintaining some gap) and, electrically, the cross-section of this turn is equivalent to the cross-section in the second state (discussed below). This results in comparatively high electrical resistance and comparatively large ohmic heating. The heat generated during conduction will raise the temperature to melt the ice, and the gaps between adjacent helical coils are substantially zero once again (i.e., in contact with one another) when the apparatus 400 is compressed to the first state. Beneficially, by the present teachings, this cleaning step is carried out by the controller located outside of the cryogenic chamber, and as such, without compromising the seal of the cryogenic chamber.

Figure 5:
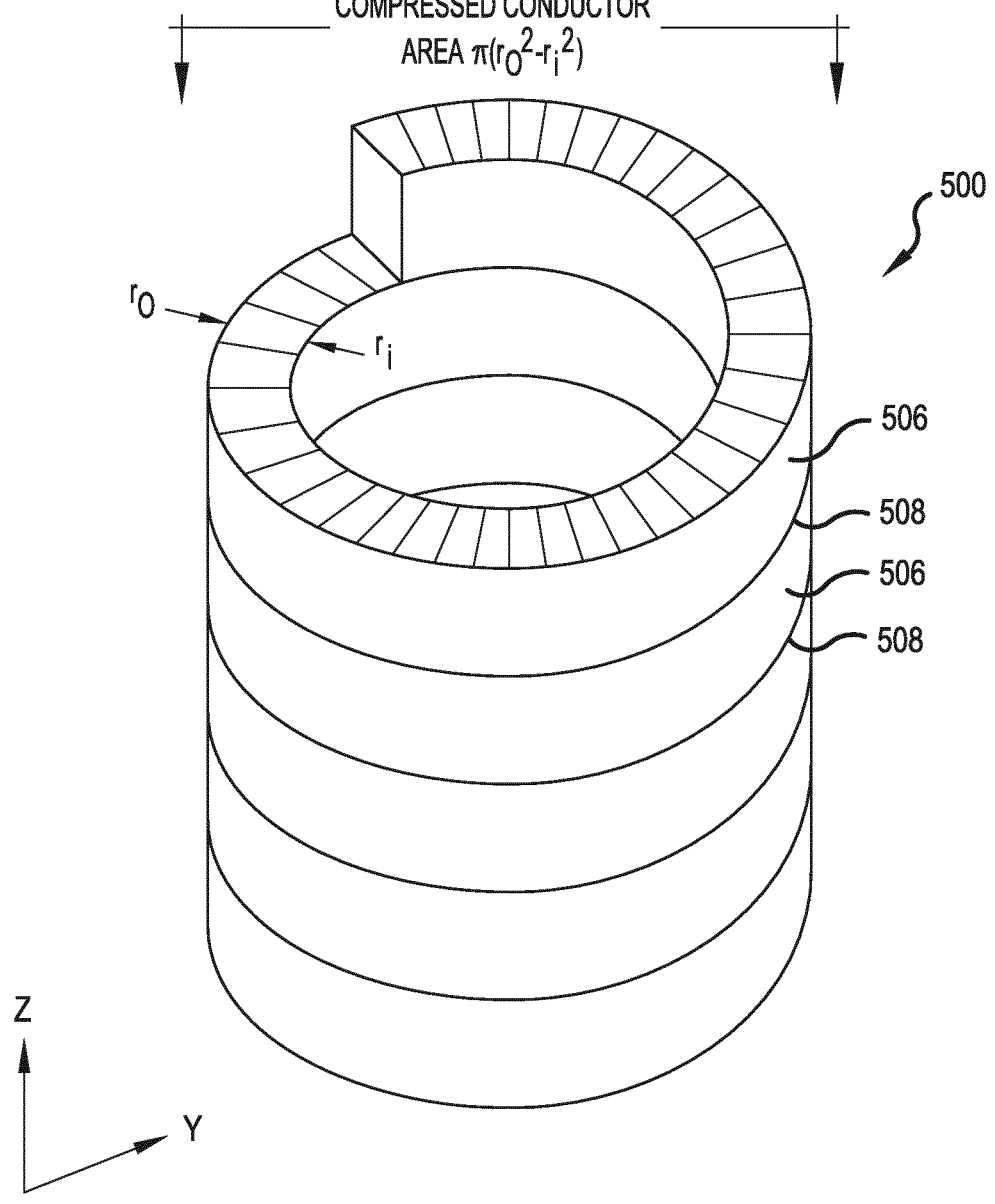
FIG. 5 is a perspective view showing a cross-sectional area of the apparatus for making an electrical connection in a cryogenic chamber in the first state according to a representative embodiment.

FIG. 5 is a perspective view showing a cross-sectional area of the apparatus 500 for making an electrical connection in a cryogenic chamber in the first state according to a representative embodiment. Various aspects and details of the apparatus 500 are similar or identical to those described in connection with representative embodiments of FIGS. 1-4, and may not be repeated to avoid obscuring the description of the present representative embodiment.

The apparatus 500 comprises a plurality of helical loops 506. The apparatus 500 provides an electrical path and a thermal path between the superconducting component and the electrical device. Like apparatuses described above, the apparatus 500 is generally made of a flexible, electrically-conductive material cut to provide seams 508 adapted to be compressed in the −z direction of the coordinate system of FIG. 5 or, as discussed below, stretched in the +z direction of the coordinate system of FIG. 5 to an expanded state. As noted above, when compressed, the seams 508 between adjacent helical loops 506 are comparatively small. Accordingly, when compressed the adjacent helical loops 506 are in intimate contact, and as a result, the apparatus 500 presents a ring-shaped conductive cross-section. Specifically, the cross-sectional area of the apparatus 500 is $\pi(r_o{}^2-r_i{}^2)$, where $r_o$ is the outer diameter of the helical loops 506 and $r_i$ is the inner diameter of the helical loops 506. As noted above, in this first state, the electrical resistance provided by the apparatus is low compared to when the apparatus is in the second state, when the adjacent helical rings are physically separated. Notably, the electrical resistance and thermal resistance of the apparatus 500 are reduced to acceptable levels. Illustratively, the electrical resistance and thermal resistance of the apparatus 500 are two orders of magnitude lower than the electrical resistance and thermal conductance of the apparatus in the second state where the helical loops 506 are separated.

In the first state a continuous electrical path is provided from one end of the apparatus 500 to the other, minimizing the effects of surface contamination. Specifically, when mating surfaces of the adjacent helical loops 506 are compressed, compressed structure (turns) are free from contamination, electricity will conduct through the large, compressed cross-section, and along the short, compressed length. Short structures, such as provided by apparatus 500 having a large cross-sectional area compared to the expanded apparatus generate comparatively minimal heat resistivity. Moreover, if mating surfaces between adjacent helical loops 506 are contaminated with ice, heat is locally generated in those areas due to the decreased conducting cross-section. As that area of the apparatus 500 is heated by the flow of electrical current, contamination will vaporize (especially in vacuum), leaving clean conducting surfaces as is desired.

Furthermore, inter-turn pressures between adjacent helical loops 506 that result in electrical conduction similar to a closed cross-section are far lower than inter-turn pressures resulting in thermal conduction similar to the closed cross-section. This means the compressed apparatus 500 acts nearly as an uninterrupted cross-section electrically, but a much smaller cross-section thermally compared to the apparatus in the expanded state when the helical loops 506 are separated.

Figure 6:
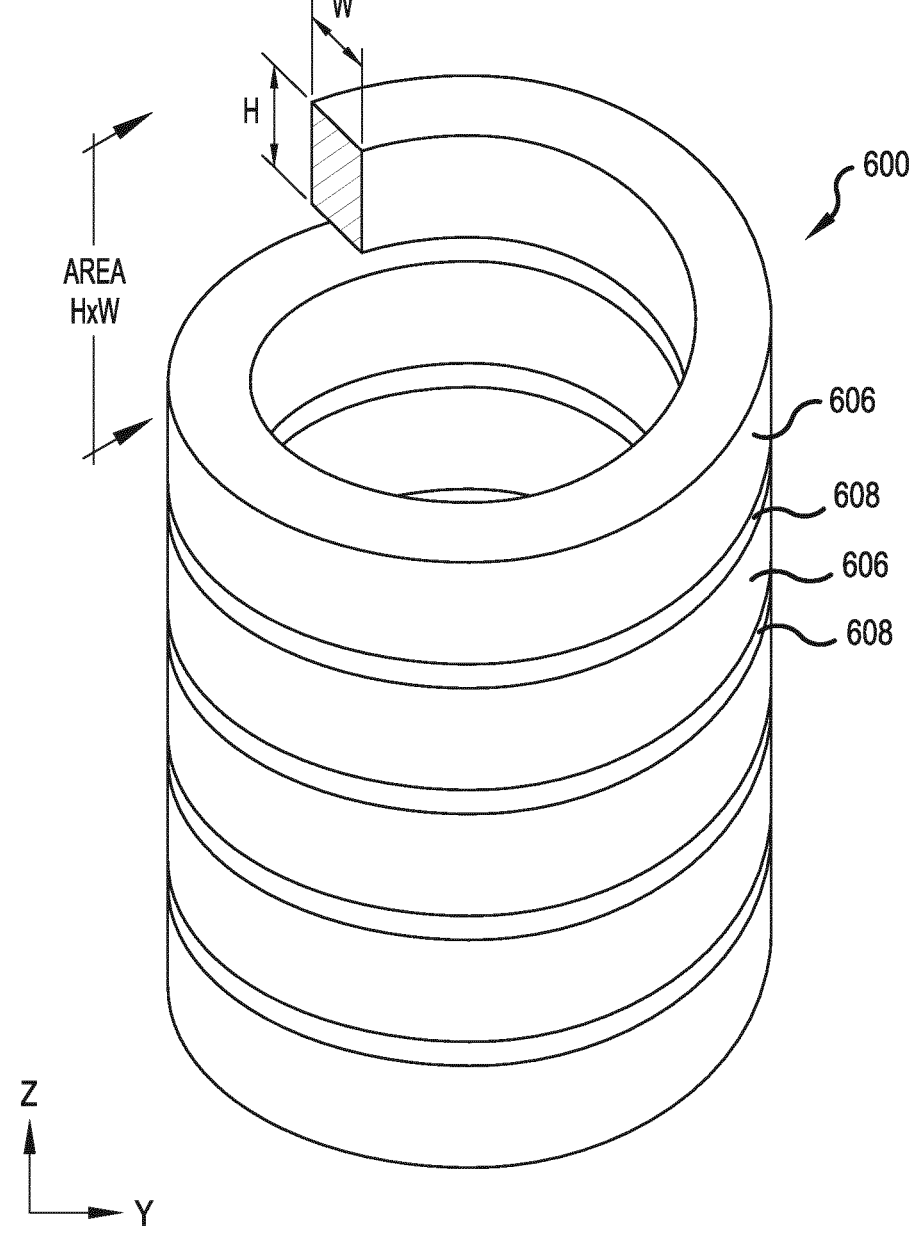
FIG. 6 is a perspective view showing a cross-sectional area of the apparatus for making an electrical connection in a cryogenic chamber in the second state according to a representative embodiment.

FIG. 6 is a perspective view showing a cross-sectional area of the apparatus 600 for making an electrical connection in a cryogenic chamber in the first state according to a representative embodiment. Various aspects and details of the apparatus 600 are similar or identical to those described in connection with representative embodiments of FIGS. 1-5, and may not be repeated to avoid obscuring the description of the present representative embodiment.

The apparatus 600 comprises a plurality of helical loops 606. The apparatus 500 provides an electrical path and a thermal path between the superconducting component and the electrical device. Like apparatuses described above, the apparatus 600 is generally made of a flexible, electrically-conductive material [cut to provide seams 608 adapted to be stretched or expanded in the +z direction of the coordinate system of FIG. 6 or, as discussed above, compressed in the −z direction of the coordinate system of FIG. 6 to a compressed state. As noted above, when stretched, the seams 608 between adjacent helical loops 606 are comparatively large. Accordingly, when the stretched or expanded adjacent helical loops 606 are stretched, the apparatus 600 presents a rectangular shape conductive cross-section having an area H×W where H is the height of the helical loop 606 and W is the width of the helical loop 606. Notably, when H=W, the apparatus presents a square shape conductive cross-section. As noted above, in this second state, the electrical resistance provided by the apparatus is high compared to when the apparatus is in the first state, when the adjacent helical rings are physically separated. Notably, the electrical resistance and thermal resistance of the apparatus 600 increased compared to the apparatus 500. Illustratively, the electrical resistance and thermal resistance of the apparatus 600 are illustratively two orders of magnitude greater than the electrical resistance and thermal conductance of the apparatus 500 in the first state where the helical coils are separated.

Notably, during periods where current does not need to be conducted across the apparatus 600, the apparatus 600 is not compressed and adjacent helical loops 606 are separated (i.e., seams 608 have a greater magnitude in the +z direction of the coordinate system of FIG. 6). In this second state, heat conducted from one end to the other of the apparatus 600 must do so through the comparatively small H×W cross-section, and along the large, uncompressed length compared to apparatus 500, which is compressed. Such comparatively long structures with small cross-sectional area provide small heat conduction compared to apparatus 500 which is compressed.

Figure 7:
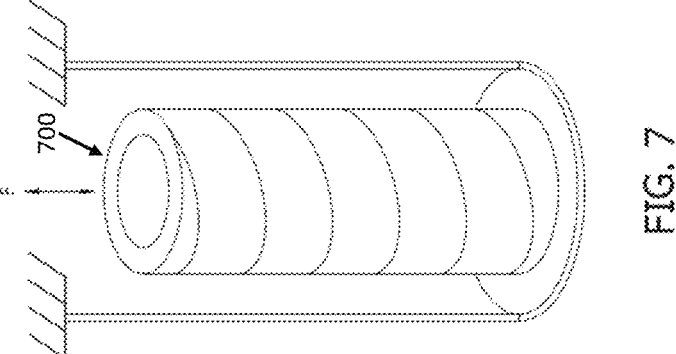
FIG. 7 is a conceptual view showing the compressive and expansive forces applied by an actuator to compress an apparatus for making an electrical connection in a cryogenic chamber from the second state into the first state.

Furthermore, heat radiated through open space of the seams 608 between adjacent helical loops 606 is reduced compared to the apparatus 500, which is compressed. This results in a temperature difference between adjacent helical loops 606 that is small compared to that of the apparatus 500. Moreover, when the apparatus 600 is used in vacuum, there is no convective heat transfer across the seams 608. Accordingly, in this second state, heat loss caused by the apparatus 600 is low compared to the apparatus 500 in which the helical loops 506 are compressed and in contact with one another FIG. 7 is a conceptual view showing the compressive and expansive forces (F) applied by an actuator to compress and stretch or expand an apparatus 700 for making an electrical connection in a cryogenic chamber from the second state into the first state. Various aspects and details of the apparatus 700 are similar or identical to those described in connection with representative embodiments of FIGS. 1-6, and may not be repeated to avoid obscuring the description of the present representative embodiment.

As shown in FIG. 7, the actuator (e.g., actuators 304, 404) are adapted to apply a force to compress (i.e., a force in the −z direction according to the coordinate system shown in FIG. 7) and to expand or stretch (i.e., a force in the +z direction according to the coordinate system shown in FIG. 7) the apparatus 700. As discussed above, when compressed by the actuator, the apparatus 700 is in the first state in which the electrical resistance is low, and the thermal conductance is high, compared to when the apparatus 700 is stretched. Similarly, when stretched by the actuator, the apparatus 700 is in the second state, and the electrical resistance is high, and the thermal conductance is low, compared to when the apparatus 700 is compressed. As noted above, the electrical resistance and the thermal conductance of the apparatus 700 in the first state are two orders of magnitude lower than the electrical resistance and the thermal conductance of the apparatus 700 in the second state.

Figure 8:
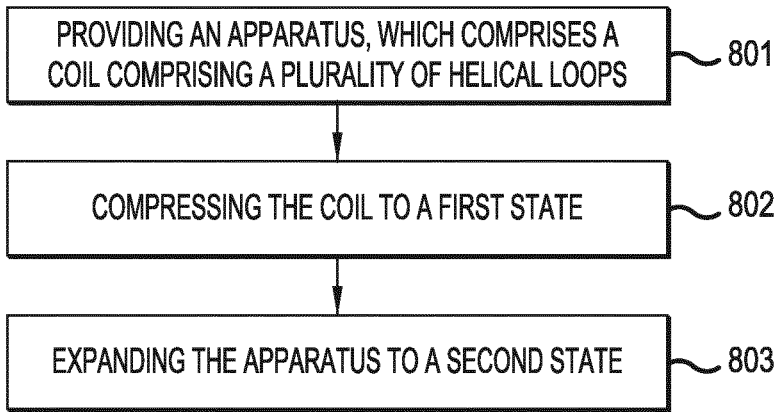
FIG. 8 is a flow-chart of a method of providing electrical current to a superconductor component disposed in a cryogenic chamber according to a representative embodiment.

FIG. 8 is a flow-chart of a method of providing electrical current to a superconductor component disposed in a cryogenic chamber according to a representative embodiment. Various aspects and details of the method 800 are similar or identical to those described in connection with representative embodiments of FIGS. 1-7, and may not be repeated to avoid obscuring the description of the present representative embodiment.

At 801, the method comprises providing an apparatus, which comprises a coil comprising a plurality of helical loops.

At 802, the method comprises compressing the coil to a first state, In the first state the apparatus has a first electrical resistance and a first thermal conductance.

At 803 the method comprises expanding the apparatus to a second state. In the second state the apparatus has a second electrical resistance and a second thermal conductance.

Although methods, systems and components for providing electrical power across an interface between a comparatively cold environment (e.g., a cryogenic chamber) and a comparatively warm environment (e.g., room temperature) with reduced thermal loss have been described with reference to several exemplary embodiments, it is understood that the words that have been used are words of description and illustration, rather than words of limitation. Changes may be made within the purview of the appended claims, as presently stated and as amended, without departing from the scope and spirit of interventional procedure optimization in its aspects. Although developing adaptable predictive analytics has been described with reference to particular means, materials and embodiments, developing adaptable predictive analytics is not intended to be limited to the particulars disclosed; rather developing adaptable predictive analytics extends to all functionally equivalent structures, methods, and uses such as are within the scope of the appended claims.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

Although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

The invention claimed is:

1. An apparatus, comprising:
   a cryogenic chamber;
   a superconducting component disposed in the cryogenic chamber;
   an electrical device disposed outside the cryogenic chamber;
   a coil comprising a plurality of helical loops and disposed in the cryogenic chamber, a first end of the coil electrically coupled to the electrical device and a second end of the coil electrically coupled to the superconducting component; and
   an actuator disposed in the cryogenic chamber and configured to compress and expand the coil between a first state and a second state, wherein in the first state the coil has a first electrical resistance and a first thermal conductance and in the second state the coil has a second electrical resistance and a second thermal conductance;
   wherein the actuator comprises a linear motor, a cam, a piston, or a rod.

2. The apparatus of claim 1, wherein the first electrical resistance is less than the second electrical resistance.

3. The apparatus of claim 1, wherein the first thermal conductance is greater than the second thermal conductance.

4. The apparatus of claim 1, wherein the coil has a first cross-sectional area in the first state and a second cross-sectional area in the second state, and the second cross-sectional area is less than the first cross-sectional area.

5. The apparatus of claim 4, wherein when the coil is in the first state, the helical loops are compressed against each other, and the first cross-sectional area is an area of a ring.

6. The apparatus of claim 4, wherein when the coil is in the second state, the helical loops are separated from each other, and the second cross-sectional area is an area of a rectangle.

7. The apparatus of claim 5, wherein when the coil is in the first state, electrical current of a first magnitude is transmitted through the coil.

8. The apparatus of claim 7, wherein when the coil is in the second state, substantially no electrical current is transmitted through the coil.

9. A method of providing electrical current to a superconductor component disposed in a cryogenic chamber, the method comprising:

providing an apparatus, which comprises a coil and an actuator disposed in the cryogenic chamber, the coil comprising a plurality of helical loops and having a first end and a second end, the first end electrically coupled to an electrical device disposed outside the cryogenic chamber and the second end electrically coupled to the superconducting component, and the actuator comprising a linear motor, a cam, a piston or a rod;

compressing the coil to a first state using the actuator, wherein in the first state the coil has a first electrical resistance and a first thermal conductance; and expanding the coil to a second state using the actuator, wherein in the second state the coil has a second electrical resistance and a second thermal conductance.

10. The method of claim 9, wherein the first electrical resistance is less than the second electrical resistance.

11. The method of claim 9, wherein the first thermal conductance is greater than the second thermal conductance.

12. The method of claim 9, wherein the apparatus has a first cross-sectional area in the first state and a second cross-sectional area in the second state, wherein the second cross-sectional area is less than the first cross-sectional area.

13. The method of claim 12, wherein when the apparatus is in the first state, the helical loops are compressed against each other, and the first cross-sectional area is an area of a ring.

14. The method of claim 12, wherein when the apparatus is in the second state, the helical loops are separated from each other, and the second cross-sectional area is an area of a rectangle.

15. A magnetic resonance imaging (MRI) system, comprising:

a magnet system comprising a superconducting magnet disposed in a cryogenic chamber;

an electrical device disposed outside the cryogenic chamber; and an apparatus for making an electrical connection between the superconducting magnet and the electrical device, the apparatus comprising:

a coil comprising a plurality of helical loops disposed in the cryogenic chamber, a first end of the coil electrically coupled to the electrical device and a second end of the coil electrically coupled to the superconducting magnet; and an actuator disposed in the cryogenic chamber and configured to compress and expand the coil between a first state and a second state, wherein in the first state the coil has a first electrical resistance and a first thermal conductance and in the second state the coil has a second electrical resistance and a second thermal conductance, wherein the actuator comprises a linear motor, a cam, a piston, or a rod.

16. The MRI system of claim 15, wherein the first electrical resistance is less than the second electrical resistance.

17. The MRI system of claim 15, wherein the first thermal conductance is greater than the second thermal conductance.

18. The MRI system of claim 15, wherein the coil has a first cross-sectional area in the first state and a second cross-sectional area in the second state, and the second cross-sectional area is less than the first cross-sectional area.

19. The MRI system of claim 18, wherein when the coil is in the first state, the helical loops are compressed against each other, and the first cross-sectional area is an area of a ring.

20. The MRI system of claim 18, wherein when the coil is in the second state, the helical loops are separated from each other, and the second cross-sectional area is an area of a rectangle.

\* \* \* \* \*